(12) United States Patent
Wong

(10) Patent No.: US 8,330,484 B2
(45) Date of Patent: Dec. 11, 2012

(54) INTEGRATED CIRCUIT AND METHOD OF TESTING THE INTEGRITY OF ELECTRICAL CONNECTION OF THE CIRCUIT TO EXTERNAL EQUIPMENT

(75) Inventor: Kelvin Wong, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 12/688,463

(22) Filed: Jan. 15, 2010

(65) Prior Publication Data
US 2011/0175624 A1    Jul. 21, 2011

(51) Int. Cl.
*G01R 31/26*    (2006.01)
*G01R 31/3187*    (2006.01)

(52) U.S. Cl. .................... 324/762.01; 324/750.3

(58) Field of Classification Search .. 324/762.01–762.1, 324/757.01–757.05, 750.01–750.3; 714/30, 714/733, 734, 724; 257/48; 438/14–18
See application file for complete search history.

(56) References Cited

U.S. PATENT DOCUMENTS

| | | | |
|---|---|---|---|
| 6,311,303 B1 | 10/2001 | Gates | |
| 6,397,361 B1 * | 5/2002 | Saitoh | 714/724 |
| 6,847,203 B1 * | 1/2005 | Conti et al. | 324/762.02 |
| 6,986,085 B2 * | 1/2006 | Rearick et al. | 714/724 |

OTHER PUBLICATIONS

Brock J. Lameres, "Physical Connections are Key in FPGA Debug", COTS Journal Online (Internet Publication), Jun. 2004, http://www.cotsjournalonline.com/articles/view/100136.

* cited by examiner

*Primary Examiner* — Tung X Nguyen
(74) *Attorney, Agent, or Firm* — Kenneth L. Sherman, Esq.; Michael Zarrabian, Esq.; Sherman & Zarrabian LLP

(57) ABSTRACT

An integrated circuit and method of testing the integrity of the electrical connection of the integrated circuit to external equipment are provided. The integrated circuit comprises an output port including output contacts for coupling the integrated circuit to external equipment, via external connectors. The output port receives internal operational signals and routes the operational signals to the output contacts for connection of the operational signals to external equipment. A connection test signal store is dynamically loadable with test signals. Signals sent to the output port can be switched between the test signals and operational signals. External equipment monitors the integrity of an electrical connection between the output contacts and the external connectors by detecting expected transitions in the test signals.

17 Claims, 3 Drawing Sheets

INTEGRATED CIRCUIT AND METHOD OF TESTING THE INTEGRITY OF ELECTRICAL CONNECTION OF THE CIRCUIT TO EXTERNAL EQUIPMENT

BACKGROUND OF THE INVENTION

1. Field of the Invention

The present invention relates to integrated circuits and in particular to methods of testing the integrity of electrical connection of such circuits to external equipment.

2. Background Information

In order to achieve greater reliability and performance of integrated circuitry, it has become desirable to pack as many functions as possible onto a single chip. This is because internal chip connections are inherently more reliable than externally wired connections and because signal speed is greater within a chip than between chips. Additionally, the lower the number of chips and the higher their density, the more chips (and consequently more overall function) can be accommodated on a product printed circuit board.

So called ASICs (Application Specific Integrated Circuits) are one well established approach to this end. In an ASIC, many standard logic functions, memory and sometimes a CPU are provided by a vendor on one chip. The interconnections between these standard components are then customized by an application developer to produce an application specific chip. The interconnections are defined by programming, using Hardware Definition Language (HDL), and then applied to the chip customizing and manufacturing process.

Also known, particularly for prototyping ASIC designs or as simpler alternatives are FPGAs (Field Programmable Gate Arrays). As the name implies, FPGAs can be programmed in the field as well as in development.

As in any development activity, the testing of circuits under development is an important aspect and is traditionally carried out by monitoring signals generated during operation. However, this becomes increasingly difficult as circuit densities increase and more function is packed into a single chip because there are more operational signals to test. Additionally, many of the signals it is desired to test are increasingly inaccessible as they only occur internally of the chip and are not present at the normal output points through which the chip is functionally connected to other components on the PCB.

U.S. Pat. No. 6,311,303 B1 to Gates et al. (Adaptec, Inc.) for a "Monitor Port with Selectable Trace Support" shows the provision of a monitor port in an integrated circuit through which signals from a large number of modular internal components can be selectively provided to an external monitor process. A Select Register is loaded to determine which signals are outputted from the monitor port. The register controls either tri-state buffers at each module or a shared multiplexer to gate the desired signals to the port.

Currently, in the development of ASICs, a similar debug port is provided through which internal signals can be selectively multiplexed out to connector pins or other contacts on a test or product PCB. Probes from a logic analyzer can then be connected to these pins to monitor the ASIC internal signals during a test run. The status of these signals during a test run can be recorded by the logic analyzer for diagnostic purposes to facilitate debugging of the circuit design.

ASIC debug ports may allow many internal signals to be multiplexed out to the diagnostic connector at any one time (a typical bus width can be 64 signals or upwards). Thus the diagnostic connector must have enough signal pins to cope including enough pins to be allocated for signal ground (essential for signal integrity when connecting to the logic analyzer). However, being used only for diagnostics, PCB designers will not devote much board real estate to accommodate large diagnostic connectors when that space could be used to populate other components which are essential for the functionality of the product PCB. Therefore, diagnostic connectors must be dense in order to pack in as many pins as possible for a given board area.

Smaller connectors mean less mechanical contact area is available when mating with a logic analyzer probe. This can affect the signal integrity of the ASIC signals being monitored. This problem is exacerbated by the fact that logic analyzer probes are getting larger and heavier due to the amount of termination circuitry that must be included to measure signals of higher and higher frequencies. They are also getting denser and denser in order to be able to monitor more and more signals. Larger probes cause more mechanical strain when they are attached to the diagnostic connector increasing the chances of bad contact and therefore loss of ASIC diagnostic information. The PCB being tested may also be integrated into a larger electronic system which means that the amount of mechanical space that allows access to the connector may be limited. This can also lead to the logic analyzer probes not being mated properly to the connector, in turn affecting signal integrity.

Another cause of loss of signal integrity can be due to wear and tear of logic analyzer probes and cables, or wear and tear of the diagnostic connector through repeated use.

These problems and various suggested connection techniques to minimize them are discussed in an article "Physical Connections are Key in FPGA Debug" by B. J. LaMeres of Agilent Technologies published in COTS Journal Online, June 2004).

However, there is still a problem of reduced signal integrity as smaller, more densely packed connectors are used to enable more signals to be monitored with minimum usage of PCB real estate. This can result in a signal appearing to be stuck at one continuous value, whereas, in fact it is simply the mechanical connection which has failed. The logic analyzer or engineer examining a signal trace may incorrectly interpret this as implying a particular circuit or design failure.

The current approach to this problem is to set up the logic analyzer and PCB, perform a test run, and record the signals from the debug port. From knowledge of the ASIC inner workings the development engineer should know which signals being monitored are expected to transition (either from high to low or low to high) during a run. If a signal which should be transitioning remains stuck at low (or high) then the connection for that signal may have been compromised for the mechanical reasons stated above. However, another reason why the signal is not transitioning may be because there is a functional problem with the ASIC that the engineer is trying to investigate. A disadvantage of this approach is, that the engineer may be unable to tell if the non-transitioning signal is due to a mechanical problem with the diagnostics connector or a functional problem with the ASIC. In depth knowledge of the ASIC design being tested is required for an engineer to make an educated decision between the two possibilities.

SUMMARY OF THE INVENTION

The foregoing problems are solved and an advance in the art is obtained by a novel integrated circuit and method of testing the integrity of the electrical connection of the integrated circuit to external equipment. The novel integrated circuit and method enable a user, such as an engineer, to quickly check the integrity of the connection between an ASIC debug port and a logic analyzer before a test run is started. This may save the engineer valuable time which can be spent diagnosing an actual ASIC problem, rather than a problem with the logic analyzer setup.

In one embodiment, an integrated circuit comprising an output port including output contacts for coupling the integrated circuit to external equipment via external connectors, the output port receiving a plurality of internal operational signals generated during operation of the integrated circuit, the operational signals routed to the output contacts for connection of the operational signals to external equipment via the external connectors. A connection test signal store is dynamically loadable with test signals. Also provided are means for switching test signals from the test signal store to the output port, wherein the external equipment monitors the integrity of an electrical connection between the output contacts and the external connectors by detecting expected transitions in the test signals as successive test signals are dynamically loaded.

In an alternative embodiment, a method for testing the integrity of an electrical connection of between external equipment and an integrated circuit. The method comprises the following steps: generating a plurality of internal operational signals during operation of the integrated circuit; routing the operational signals to output contacts of an output port of the integrated circuit for connection of the operational signals to external equipment, the operational signals connected to the external equipment via external connectors; providing a set of transitioning test signals in addition to the operational signals; applying the test signals to the output port and to the output contacts; and monitoring the transitions of the test signals received by the external equipment to determine the integrity of the electrical connections between the output contacts and the external connectors.

DESCRIPTION OF THE PREFERRED EMBODIMENTS

This invention is described in preferred embodiments in the following description with reference to the Figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

An embodiment of the invention comprises a integrated circuit and method of testing the integrity of the electrical connection of the integrated circuit to external equipment. The integrated circuit and method enable a user, such as an engineer, to quickly check the integrity of the connection between an ASIC debug port and a logic analyzer before a test run is started. This may save the engineer valuable time which can be spent diagnosing an actual ASIC problem, rather than a problem with the logic analyzer setup. Should a problem be detected with the analyzer setup, then the embodiment can also help diagnose that problem, for example, to determine which signals are not transitioning properly. The engineer can then take appropriate action to remedy the situation.

Figure 1:
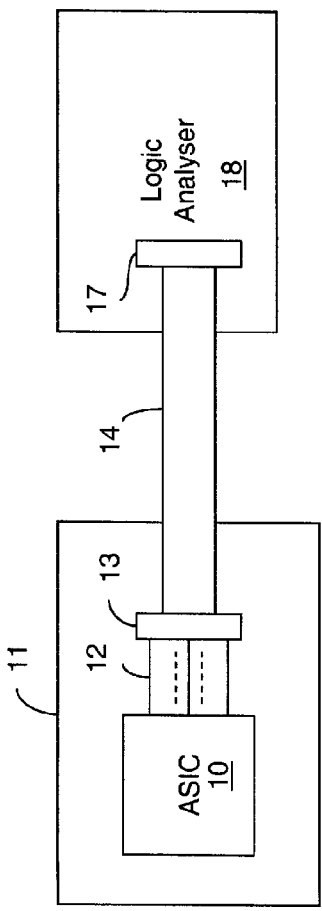
FIG. 1 is a schematic plan view of a debug test arrangement by a logic analyzer for an ASIC chip, which may be an integrated circuit according to one embodiment.
Figure 2:
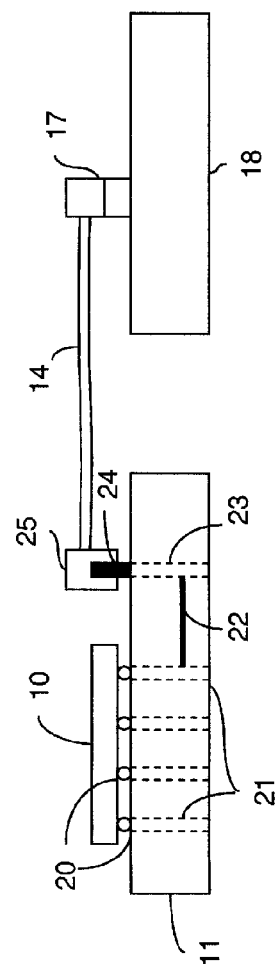
FIG. 2 is a schematic side view of the test arrangement of FIG. 1, showing an electrical pathway between an ASIC and the logic analyzer in more detail.
Figure 3:
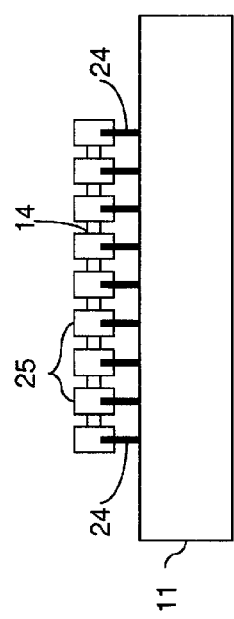
FIG. 3 is an end view of a connector arrangement between a PCB on which the ASIC of FIGS. 1 and 2 is mounted and a cable to the logic analyzer.

FIGS. 1 to 3 illustrate a test arrangement of a schematic mechanical set up for debugging an ASIC chip 10, according to one embodiment.

As shown in FIG. 1, the ASIC 10 is mounted on a test or product printed circuit board 11 and internal signals generated during a test run, available at a debug port of the chip, are led out by a bus 12 to an on-PCB connector arrangement 13. A cable 14 connects these signals, through a connector block 17, to a logic analyzer 18 whose basic function is to debug the ASIC design.

With reference to FIG. 2, a debug port comprises conventional solder ball connection points 20, only four being shown for simplicity of illustration. Via conductors 21 within the PCB conduct the signals to internal or surface metallization paths, such as 22, constituting the bus 12. Further via conductors, such as 23, then bring the signals out to the on-PCB connector 13.

The connector 13 is represented schematically in FIGS. 2 and 3 as a series of pins 24, which receive probe connectors 25 which are themselves connected to the cable 14. As illustrated, the pins 24 are individually connected to probes 25 and the electrical connection between individual pin and probe pairs may become susceptible to connectivity faults due to the greater density of connector pairs and the greater bulk of the probes.

It should be realized however that the pin and probe connection shown is only one of several possible arrangements for connecting the internal signals to the logic analyzer cable 14. Alternatives might be contact pads instead of pins and compression probes. Commercial connector blocks may be used, if a sufficiently high density is available. Regardless of the connector system used, because of the high density of these connectors and the space constraints on them, the electrical connections can be faulty.

Figure 4:
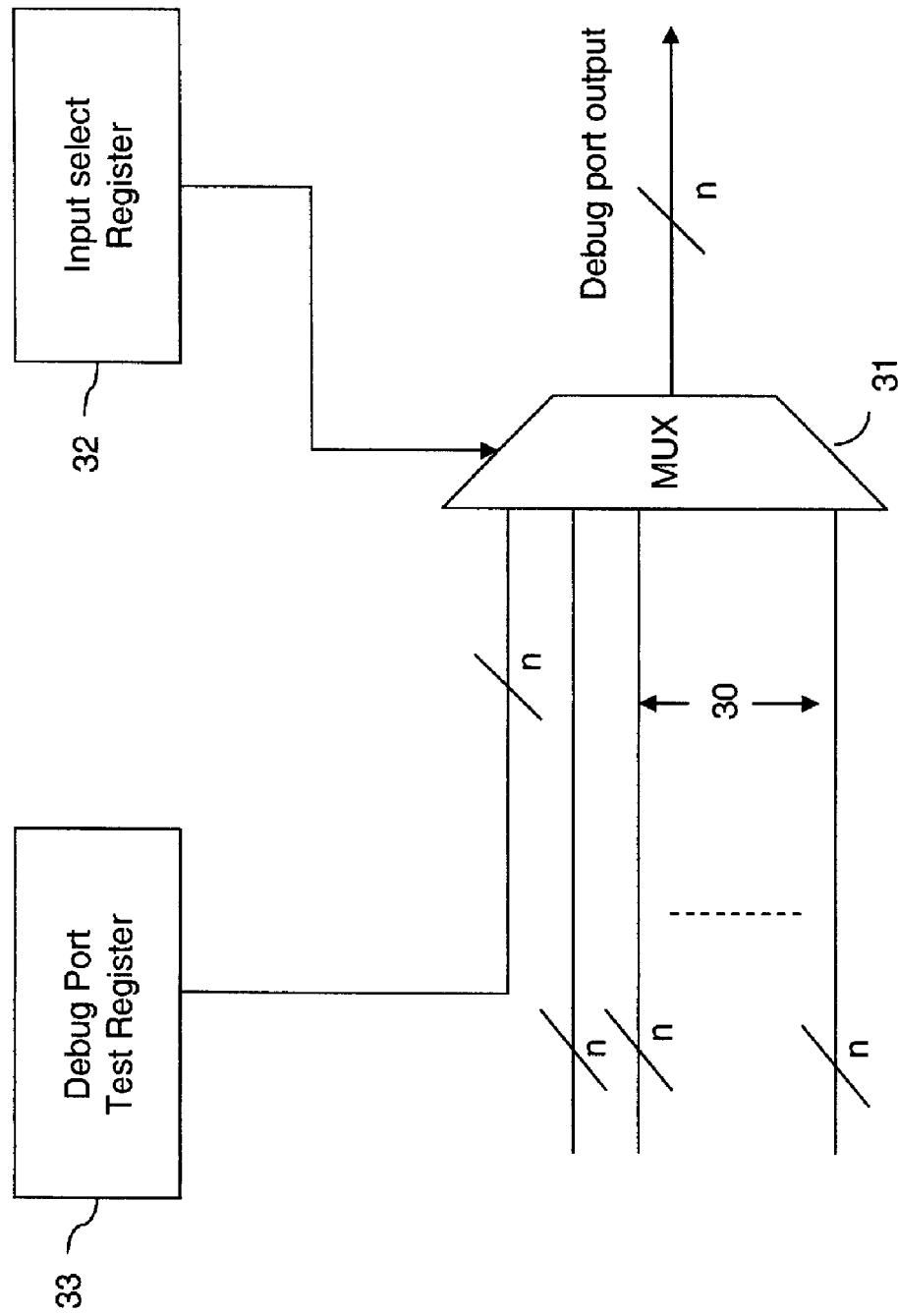
FIG. 4 is a schematic of internal circuit components of an integrated circuit according to one embodiment.

Referring to FIG. 4, according to one embodiment, internal buses 30, each of which can carry n bits, connect signal sample points within the ASIC to a multiplexer 31. A selection of signals are applied to the on-PCB connector 13 of FIG. 1 is made according to the contents of an Input Select Register 32. This register is in the ASIC addressable memory space and can be preloaded and dynamically changed by appropriate programming by the test engineer to determine the outputs from the multiplexer 31.

In one embodiment, a further Debug Port Test Register 33 is also embedded in the ASIC. For a debug port of width n signals, a test register of width n bits is provided. This register 33 is also accessible within the ASIC address range so its value can easily be programmed with successive test patterns by the ASIC engineer. The n-bit output of this register is also connected to the multiplexer 31. A special value is programmed into the Input Select Register 32 to allow the test patterns from the Debug Port Test Register 33 to be multiplexed onto the ASIC debug port instead of the actual operational signals on buses 30

The test patterns are altered so as to change the value of each bit of the Debug Port Test Register 33 from low to high and back again. Changing the value of the test register thus changes the value of the signals at the debug port. These changes can then be monitored and recorded by the attached logic analyzer. The ASIC engineer can then check that each signal being monitored on the debug port is transitioning correctly (from low to high and from high to low) before the actual run to test the ASIC is started. Detection of a transition indicates prima facie that the connection between each of the on-PCB connectors and its respective logic analyzer probe is sound.

Thus, the approach described above enables a user, such as an engineer, to quickly check the integrity of the connection between the ASIC debug port and the logic analyzer before a test run is started. This may save the engineer valuable time which can be spent diagnosing the actual ASIC problem rather than a problem with the logic analyzer setup. Should a problem be detected with the analyzer setup then the embodiment can also help diagnose that problem, e.g. determine which signals are not transitioning properly. The engineer can then take appropriate action to remedy the situation.

Different test pattern sequences can be employed. The simplest is simply to change all bits of the Test Register simultaneously for a quick indication that the probe connections are working.

However, in order to detect any shorts between the signals of the debug port, a walking "ones" test pattern could be used whereby bits of the Test Register are changed in succession. If any of the on-PCB connectors are shorted together, then more than one bit will appear to change at a time and can be detected by the engineer from the probed output to the logic analyzer.

Figure 5:
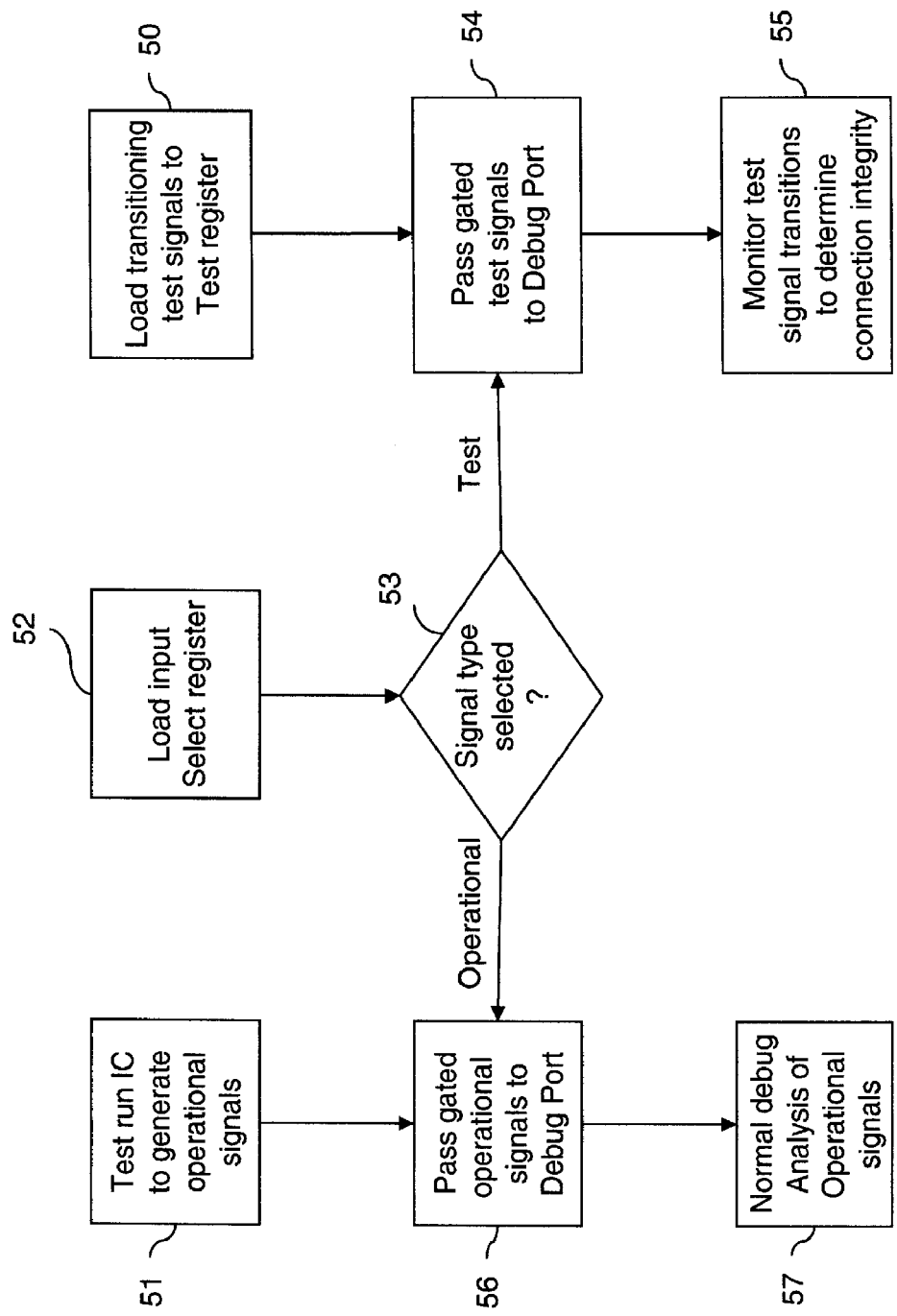
FIG. 5 is a flow diagram illustrating a method according to one embodiment employing the circuitry of FIG. 4.

With reference to FIG. 5, there is shown one embodiment of a method as implemented in the apparatus of FIGS. 1 to 4. Referring to the Figure, successively changing test signal patterns are loaded in step 50 into the Debug Port Test Register 33 of FIG. 2. At the same time, if the ASIC is running, normal internal operational signals are being generated within the ASIC in step 51.

Input Select Register 32 is loaded in step 52 with data which determines in step 53 which signal lines 30 will be passed by multiplexer 31 to the debug port. If it is desired to test the integrity of the electrical connection between the on-PCB contacts 24 and the external probe connectors 25 of the logic analyzer cable 14, then the debug port test register 33 output is selected and the multiplexer 31 passes the transitioning test signals in step 54 to the debug port. The test signals are then transmitted over cable 14 to logic analyzer 18 and displayed or otherwise analyzed, in step 55, to determine the integrity of the tested connections. It will be realized that connection faults in the logic analyzer connector block 17 will also be detected by this arrangement but these are unlikely to be as frequent as those at connector 13 because of less constraints on packaging.

In the alternative, if the input Select Register 32 contains a value corresponding to selection of operational signals, step 53 causes the operational signals should be passed by multiplexer, in step 56, to the output port for normal debugging by the logic analyzer 18 in step 5710.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. An integrated circuit comprising:
   an output port comprising an integrated circuit debug port including output contacts for coupling the integrated circuit to external equipment via external connectors, the output port receiving a plurality of internal operational signals generated during operation of the integrated circuit on a plurality of busses, the operational signals routed to the output contacts for connection of the operational signals to external equipment via the external connectors;
   a connection test signal store dynamically loadable with output contact test pattern signals generated by the integrated circuit;
   means for selecting operational signals from the integrated circuit or test pattern signals from the connection test signal store for passing to the output port, wherein upon selection of the test patterns from the connection signal store the external equipment monitors the integrity of electrical connections between each of the output contacts and the external connectors by detecting expected transitions in each signal of the test pattern signals as successive transitioning test signal sequences that are dynamically loaded for testing integrity of the electrical connections.

2. The integrated circuit of claim 1 wherein the means for selecting includes gate means and connection means for connecting both the operational internal signals and test pattern signals from the test signal store to the gate means, the output of the gate means connected to the output port.

3. The integrated circuit of claim 2 further comprising:
   a selection register connected to the gate means, the gate means arranged to pass either test pattern signals or selected operational signals to the output port in dependence on the contents of the selection register.

4. The integrated circuit of claim 3 wherein the gate means comprises a multiplexer.

5. The integrated circuit of claim 1 wherein the integrated circuit is an application specific integrated circuit (ASIC).

6. The integrated circuit of claim 5 wherein the test connection signal store is a test register, and the test register and the selection register comprise a portion of an addressable memory space of the ASIC.

7. The integrated circuit of claim 1 wherein the internal operational signals are selected for debugging analysis by the external equipment.

8. A method for testing the integrity of an electrical connection of between external equipment and an integrated circuit, the method comprising:
   generating a plurality of internal operational signals during operation of the integrated circuit;
   routing the operational signals to output contacts of an output port of the integrated circuit comprising an integrated circuit debug port for connection of the operational signals to external equipment, the operational signals connected to the external equipment via external connectors;
   providing a set of transitioning and successive test pattern signals generated by the integrated circuit in addition to the operational signals;
   selecting the test pattern signals or the operational signals for passing to the output port and to the output contacts; and
   upon selecting the test pattern signals, monitoring the sequential transitions of each of the test pattern signals received by the external equipment for determining the integrity of each of the electrical connections between the output contacts and the external connectors.

9. The method of claim 8 further comprising:
   applying the test pattern signals and the internal operational signals to a gate means; and providing a selection signal to the gate means to selectively control the gate means to pass either test pattern signals or internal operational signals to the output port.

10. The method of claim 8 further comprising:

transitioning the values of all test pattern signals simultaneously.

11. The method of claim 8 further comprising:

transitioning the values of each test pattern signal in succession.

12. The method of claim 8 further comprising:

changing a value of each test pattern signal applied to the output port between low and high values and between high and low values.

13. The method of claim 12 further comprising:

changing the value of each test pattern signal applied to the output port between low and high values and between high and low values in succession.

14. The method of claim 8, further comprising programming a value into an input select register such that the test pattern signals from a debug port test register are multiplexed onto the output port instead of actual operational signals on the one or more busses, wherein the output port comprises an application specific integrated circuit (ASIC) debug port.

15. The method of claim 14, further comprising:

changing a value of each bit of the debug port test register for altering a test pattern sequence applied to the output port between low and high values and between high and low values in succession.

16. The method of claim 15, wherein each connection between the ASIC debug port and a logic analyzer is tested prior to testing operation of the integrated circuit.

17. The method of claim 15, wherein each connection between on-printed circuit board (on-PCB) contacts and external probe connectors are tested using the test pattern signals.

* * * * *